(12) United States Patent
Hampel et al.

(10) Patent No.: US 7,398,333 B2
(45) Date of Patent: Jul. 8, 2008

(54) INTEGRATED CIRCUIT INPUT/OUTPUT INTERFACE WITH EMPIRICALLY DETERMINED DELAY MATCHING

(75) Inventors: Craig E. Hampel, San Jose, CA (US); Scott C. Best, Palo Alto, CA (US)

(73) Assignee: Rambus Inc., Los Altos, CA (US)

( * ) Notice: Subject to any disclaimer, the term of this patent is extended or adjusted under 35 U.S.C. 154(b) by 522 days.

(21) Appl. No.: 10/899,719

(22) Filed: Jul. 21, 2004

(65) Prior Publication Data

US 2005/0063163 A1    Mar. 24, 2005

(51) Int. Cl.
   *G06K 9/36* (2006.01)
   *G06F 1/04* (2006.01)
   *H04L 7/02* (2006.01)

(52) U.S. Cl. ............... 710/15; 710/38; 375/295; 375/356; 713/400; 713/401

(58) Field of Classification Search .............. 710/15, 710/38; 375/295, 356; 713/401, 400
   See application file for complete search history.

(56) References Cited

U.S. PATENT DOCUMENTS

| | | | |
|---|---|---|---|
| 5,554,945 A | 9/1996 | Lee et al. ............... | 327/105 |
| 5,852,640 A | 12/1998 | Kliza et al. ............... | 375/356 |
| 6,292,903 B1 | 9/2001 | Coteus et al. ............... | 713/401 |
| 6,658,732 B2 * | 12/2003 | Doberenz ............... | 29/846 |
| 6,816,505 B1 * | 11/2004 | Sutardja et al. ............... | 370/463 |
| 6,847,267 B2 * | 1/2005 | Flake et al. ............... | 333/20 |
| 6,998,870 B1 * | 2/2006 | Gulick et al. ............... | 326/30 |
| 2005/0213684 A1 * | 9/2005 | Flake et al. ............... | 375/295 |

OTHER PUBLICATIONS

Ryu, W.H., et al., "High-Frequency Simultaneous Switching Output Noise (SSO) Simulation Methodology for a DDR333/400 Data Interface," Ansoft High-Speed Design Forum, Jun. 27, 2002.

* cited by examiner

*Primary Examiner*—Tammara Peyton
(74) *Attorney, Agent, or Firm*—Morgan, Lewis & Bockius LLP

(57) ABSTRACT

An integrated circuit input/output interface with empirically determined delay matching is disclosed. In one embodiment, the integrated circuit input/output interface uses empirical information of the signal traces to adjust the transmit/receive clock of each pin of the interface so as to compensate for delay mismatches caused by differences in signal trace lengths. The empirical information, in one embodiment, includes signal flight time of each signal trace, which can be pre-measured or pre-calculated from known signal trace lengths. The empirical information, in another embodiment, includes trace-specific phase offset values calculated from pre-calculated or pre-measured signal flight times or signal trace lengths. In yet another embodiment, a transmitting device generates a set of serially delayed write clocks, which are used to control symbol transmission over signal traces so as to reduce simultaneous switching output noise and ground bound in the transmitting device.

22 Claims, 7 Drawing Sheets

INTEGRATED CIRCUIT INPUT/OUTPUT INTERFACE WITH EMPIRICALLY DETERMINED DELAY MATCHING

BRIEF DESCRIPTION OF THE INVENTION

The present invention relates generally to communication along signal traces, and more specifically to an integrated circuit input/output interface with empirically determined delay matching.

BACKGROUND

To satisfy the ever increasing need for bandwidth, the external I/O interfaces of Central Processing Units (CPU's) and other semiconductor components have increased significantly both in frequency and data width. The increase in frequency has resulted in system designs that must carefully match the electrical length of signal traces between a CPU and a memory controller such that synchronous signals can be received with a common clock and a common phase. This design requirement is sometimes known as "length matching" or "delay matching." Length matching can be difficult given the serpentine routing required for many signal traces. While the following discussion concerns the parallel transmission of data and clock signals, the same considerations also apply to systems using source synchronous strobing, where a strobe signal is transmitted in parallel with a data signal.

Length matching, however, has a number of undesirable consequences, including increased Electro-Magnetic Interference (EMI) from the increased routing area, increased power consumption from the larger total trace capacitance and resistance, increased board area, and increased board layer count. Length matching also increases coupling between signals, thus reducing their Signal-to-Noise Ratio (SNR). In other words, length matching increases system costs and power consumption and lowers overall system performance. In addition, carefully aligning data transitions increases the simultaneous switching output (SSO) noise of the transmitting device and increases the "ground bounce" associated with turning on many output drive transistors simultaneously. SSO and ground bounce can, in some devices, limit the switching frequency at which a device will function both properly and within regulatory noise limits.

Several techniques to free a system designer from the need to length match are known. One such technique is known as CDR, where the clock signal is carried on the same wire (or differential pair of wires) as the data. However, in order to use CDR, both the CPU and the memory controller must be equipped with special CDR circuitry. Most CPU's, however, do not have such circuitry. Also, using CDR to recover data introduces additional latency and power consumption.

Another technique involves performing a timing sweep to determine the optimal transmit or receive timing. This technique, while applicable to many integrated circuits, is not ideal for calibrating the CPU-memory controller interface because it requires the active participation of the CPU and the memory controller and suffers from a "live lock" problem. That is, the CPU and the memory cannot communicate timing information reliably in either direction before they are synchronized by a software algorithm. But the software algorithm cannot be reliably executed by the CPU prior to the establishment of proper transmit and receive timing.

Accordingly, what is needed is an alternative to length matching that enables high speed data communication between one integrated circuit (e.g., a CPU) and another integrated circuit (e.g., a memory controller) without requiring special circuitry for at least one of the devices.

BRIEF DESCRIPTION OF THE DRAWINGS

Aspects of the description will be more readily apparent from the following description and appended claims when taken in conjunction with the accompanying drawings, in which:

DESCRIPTION OF EMBODIMENTS

Embodiments of the invention are described below. In the interest of clarity, not all features of an actual implementation are described. It will be appreciated that in the development of any such embodiment, numerous implementation-specific decisions may be made to achieve the developers' specific goals, such as compliance with system-related and business-related constraints, which will vary from one implementation to another. Moreover, it will be appreciated that such a development effort might be complex and time-consuming, but would nevertheless be routine for those undertaking such a task having the benefit of this disclosure.

In one embodiment, integrated circuitry is provided to compensate for delay differences caused by unmatched signal trace lengths. The integrated circuitry uses empirical information for at least some of the signal traces on a circuit board or other interconnect system. That empirical information may be stored in a memory coupled to the integrated circuitry. The empirical information may then be used by an integrated circuit coupled to those signal traces to generate trace-specific clock signals (or more generally, timing signals) so as to compensate for delay differences caused by unmatched signal lengths.

In another embodiment, a system is provided to compensate for delay differences caused by unmatched signal trace lengths. The system may include a package, multiple integrated circuits within the package, and signal traces coupling said integrated circuits. The system may also include a memory coupled to at least one of the integrated circuits and having stored therein pre-determined empirical information of the signal traces for use by the at least one integrated circuit to generate trace-specific signals according to the pre-determined empirical information so as to compensate for delay differences that are at least partially caused by unmatched signal trace lengths.

In yet another embodiment, an integrated circuit is provided to compensate for delay differences caused by unmatched signal trace lengths. The integrated circuit includes multiple circuits on a single integrated circuit, signal traces coupling said circuits, and a memory coupled to at least one of the circuits. The memory stores therein pre-determined empirical information of the signal traces for use by the at least one circuit to generate trace-specific signals according to the pre-determined empirical information so as to compensate for delay differences that are at least partially caused by unmatched signal trace lengths.

Figure 1:
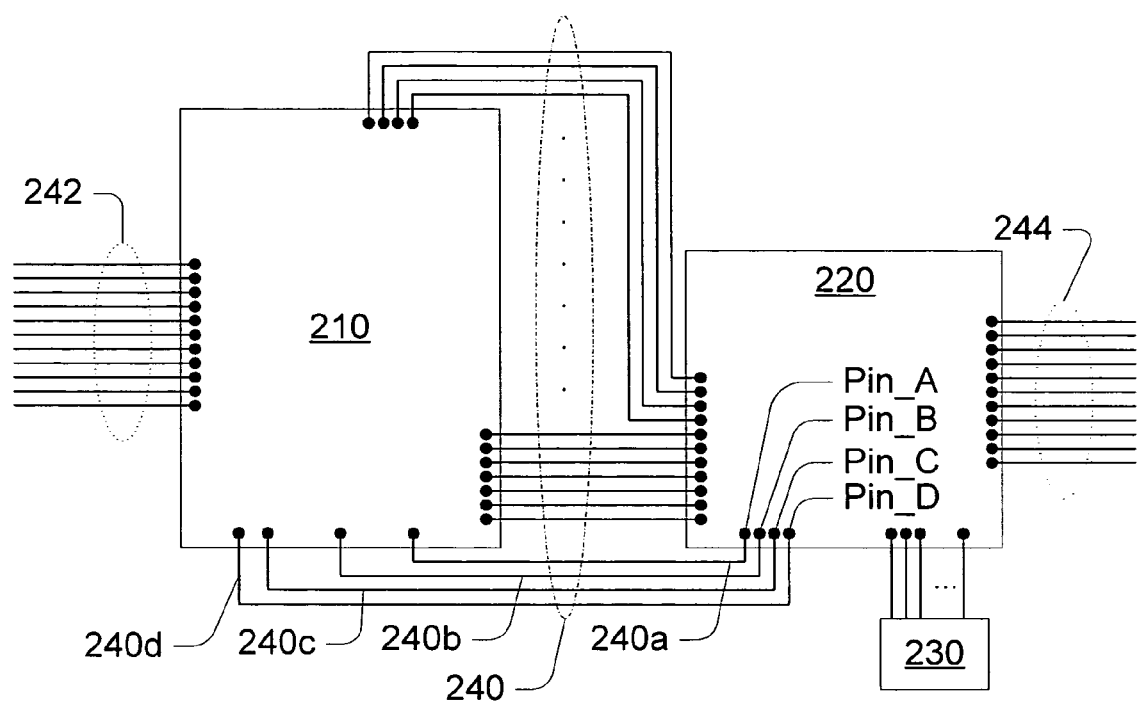
FIG. 1 depicts a portion of a circuit board having unmatched signal traces.
Figure 2:
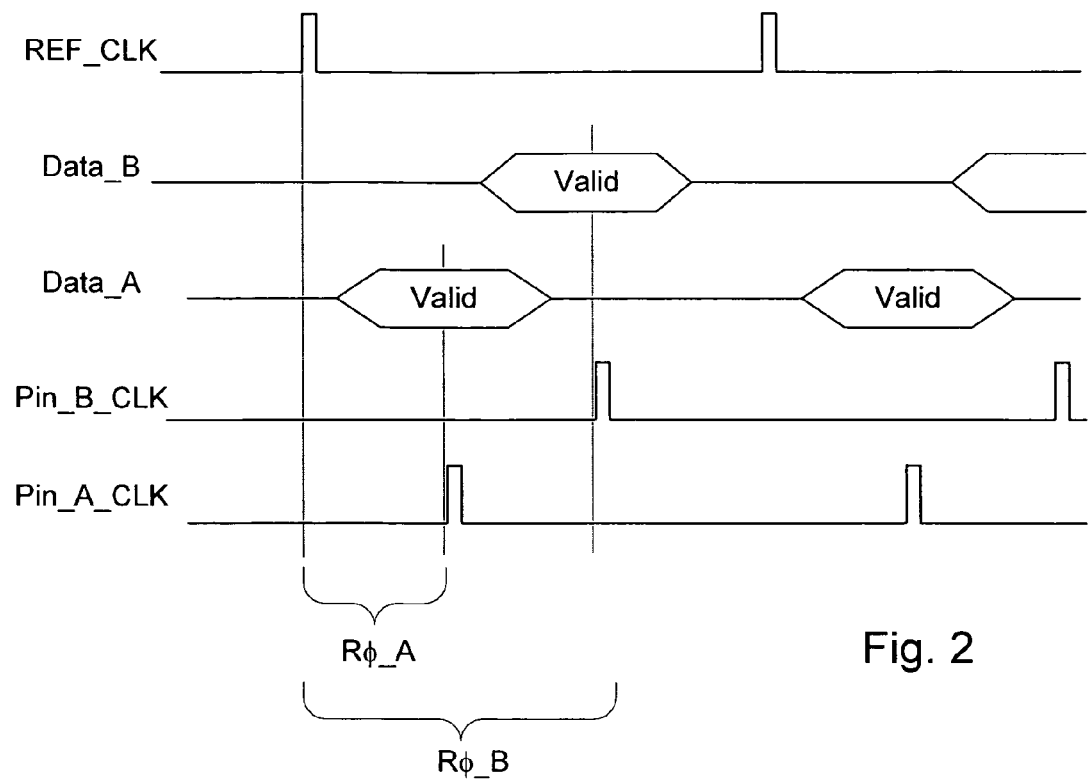
FIG. 2 depicts the timing of various clock signals and data signals associated with some of the signal traces of FIG. 1.

FIG. 1 shows a simplified representation of portion of a printed circuit board 200 having a number of signal traces 240 for coupling to two integrated circuits 210 and 220. In one embodiment, the integrated circuit 210 is a processor, and the integrated circuit 220 is a memory controller. However, in other embodiments other types of circuits may be interconnected by the signal traces 240. Also shown are signal traces 242 and 244 for coupling other integrated circuits or electronic devices to the integrated circuits 210 and 220. Note that the electrical lengths of the signal traces 240 are unmatched. Some of the signal traces 240 are longer than others, while some of the signal traces have the same length. As a result, the signal flight times of the signal traces 240 are not uniform. That is, the time a signal may take to travel from one end of a signal trace to another end varies among the signal traces 240. If the integrated circuits 210 and 220 are both synchronous devices (e.g., devices that transmit and receive signals from the signal traces 240 synchronously with a bus clock signal), the differences in signal flight times will cause some signals to arrive at the receiving ends of the signal traces having different phases with respect to a bus clock signal or data strobe. In other words, if all the signals are transmitted from one device (e.g., circuit 220) having the same phase with respect to a clock signal or data strobe, those same signals will arrive at the other device (e.g., circuit 210) having a variety of different clock phases with respect to the clock signal or data strobe. For low speed data communication where the data clock cycle is orders of magnitude larger than the signal flight times, unmatched signal lengths generally do not pose a significant design problem because the resulting phase differences are rarely large enough to cause data transmission errors. However, for high speed data communication where the data clock cycle is comparable to the signal flight times, the signals will appear to be out of phase with each other at the receiving ends. Timing diagrams for an exemplary data clock signal REF_CLK (used in conjunction with transmitting data from circuit 210 to circuit 220) and two exemplary source synchronous signals Data_A and Data_B arriving at Pin_A and Pin_B of the integrated circuit 220 are shown in FIG. 2. Note that the Data_B lags behind Data_A because Pin_B is coupled to the signal source via signal trace 240b, which is longer than the signal trace 240a to which Pin_A is coupled.

It is noted that for the purposes of this document, the term "data signal" includes not only memory content data signals, but address and control signals as well. The time of flight and delay matching issues addressed in this document are substantially the same for all types of signals conveyed over printed circuit board traces, or the like, from one device to another.

FIG. 2 also illustrates timing diagrams for two trace-specific clock signals (or pin-specific clock signals) Pin_A_CLK and Pin_B_CLK used by the integrated circuit 220 to sample the signals Data_A and Data_B. The trace-specific clock signals, in one embodiment, have the same frequency as the reference clock signal REF_CLK, but not the same phase. The Pin_A_CLK signal is offset from the reference clock signal REF_CLK by a phase of R$\phi$_A, and the Pin_B_CLK signal is offset from REF_CLK by a phase of R$\phi$_B. When the data signals Data_A and Data_B are sampled by different trace-specific clock signals, the data will appear to have arrived synchronously in spite of unmatched signal trace lengths.

With reference again to FIG. 1, there is shown a memory 230, which may be a non-volatile memory such as an EEPROM, for storing empirical information of the signal traces for use by the integrated circuit 220 to generate the trace-specific clock signals. In one embodiment, the empirical information may include the values representative of the length of each of the signal traces 240. In this embodiment, the integrated circuit 220 includes circuitry for determining the appropriate phase offsets from the length values and the frequency of the reference clock. In another embodiment, the empirical information includes value(s) representative of the pre-measured or pre-calculated signal flight time for each signal trace 240. Calculation of the signal flight times can be made once the signal trace lengths are known. The signal trace length information can be obtained by physically measuring the signal traces. In one embodiment, the signal trace length information may be obtained from Computer-Aided Design (CAD) files that store the layout information of the signal traces.

In one embodiment, the memory 230 stores pre-calculated phase offset values to be used by the integrated circuit 220 to generate the trace-specific clock signals. The pre-calculated offset values are determined from the signal trace lengths and a bus clock frequency. In some embodiments where it is desirable to support multiple bus clocks, the pre-calculated offset values can be stored in different frequency-specific lookup tables of the memory 230. In those embodiments, the integrated circuit 220 includes circuitry for receiving the pre-calculated offset values and circuitry for using the pre-calculated offset values to generate the trace-specific clock signals. The mapping of delay values to phase offsets is a function of the operating frequency. The phase offsets may be dynamically computed, based on a current frequency value (e.g., the selected operating frequency), or the phase offsets may be precomputed for two or more predefined operating frequencies, with the phase offsets for each frequency being stored in a memory such as memory 230.

With reference still to FIG. 1, the circuit board 200 can include an optional dummy signal trace 250 that has a pre-defined length. In this embodiment, the signal flight time across the dummy signal trace 250 may be measured and compared to a reference signal flight time to generate a multiplier, which can be used by the integrated circuit 220 to account for delay differences caused by variations in the circuit board fabrication processes. More specifically, the integrated circuit 220 uses the multiplier, other empirical information stored in the memory 230, and a data clock frequency to determine phase offset values for the signal traces 240. In some other embodiments, the memory 230 stores trace-specific phase offset values that are calculated based on the multiplier, the signal trace lengths, and one or more data clock frequencies.

Figure 3:
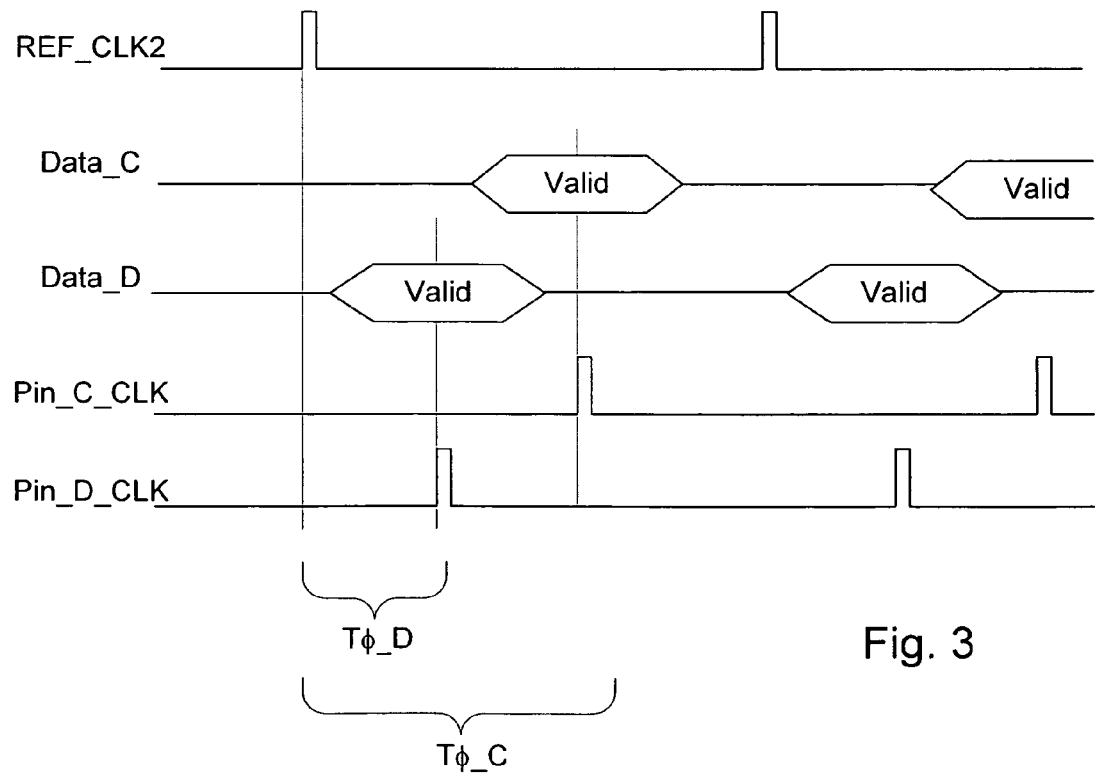
FIG. 3 depicts the timing of various clock signals and data signals associated with some of the signal traces of FIG. 1.

In one embodiment each signal trace 240 is associated with two trace-specific clock signals, one for each transmission direction. FIG. 3 illustrates the timing diagrams of a reference clock signal REF_CLK2 (used in conjunction with transmitting data in a single direction, from circuit 220 to circuit 210), data signals Data_C and Data_D, and trace-specific clock signals Pin_C_CLK and Pin_D_CLK when signal trace 240c (FIG. 1) and 240d (FIG. 1) are used to communicate data signals Data_C and Data_D from the integrated circuit 220 (FIG. 1) to the integrated circuit 210 (FIG. 1). The trace-specific clock signals Pin_C_CLK and Pin_D_CLK have the same frequency as the reference clock signal REF_CLK2, but not the same phase. The Pin_C_CLK signal is offset from the reference clock signal REF_CLK2 by a phase of $T\phi\_C$, and the Pin_D_CLK signal is offset from REF_CLK2 by a phase of $T\phi\_D$. Note that signal trace 240c (FIG. 1), which is coupled to Pin_C of integrated circuit 220 (FIG. 1), is shorter than signal trace 240d (FIG. 1). To compensate for this difference, the transmit clock signal Pin_D_CLK has a phase lead over the transmit clock signal Pin_C_CLK such that Data_C and Data_D both arrive synchronously at the integrated circuit 210 (FIG. 1). The trace-specific clock signals Pin_C_CLK and Pin_D_CLK are generated using empirical information stored in the memory 230 (FIG. 1) and/or other information using methods similar to those discussed above.

Figure 4:
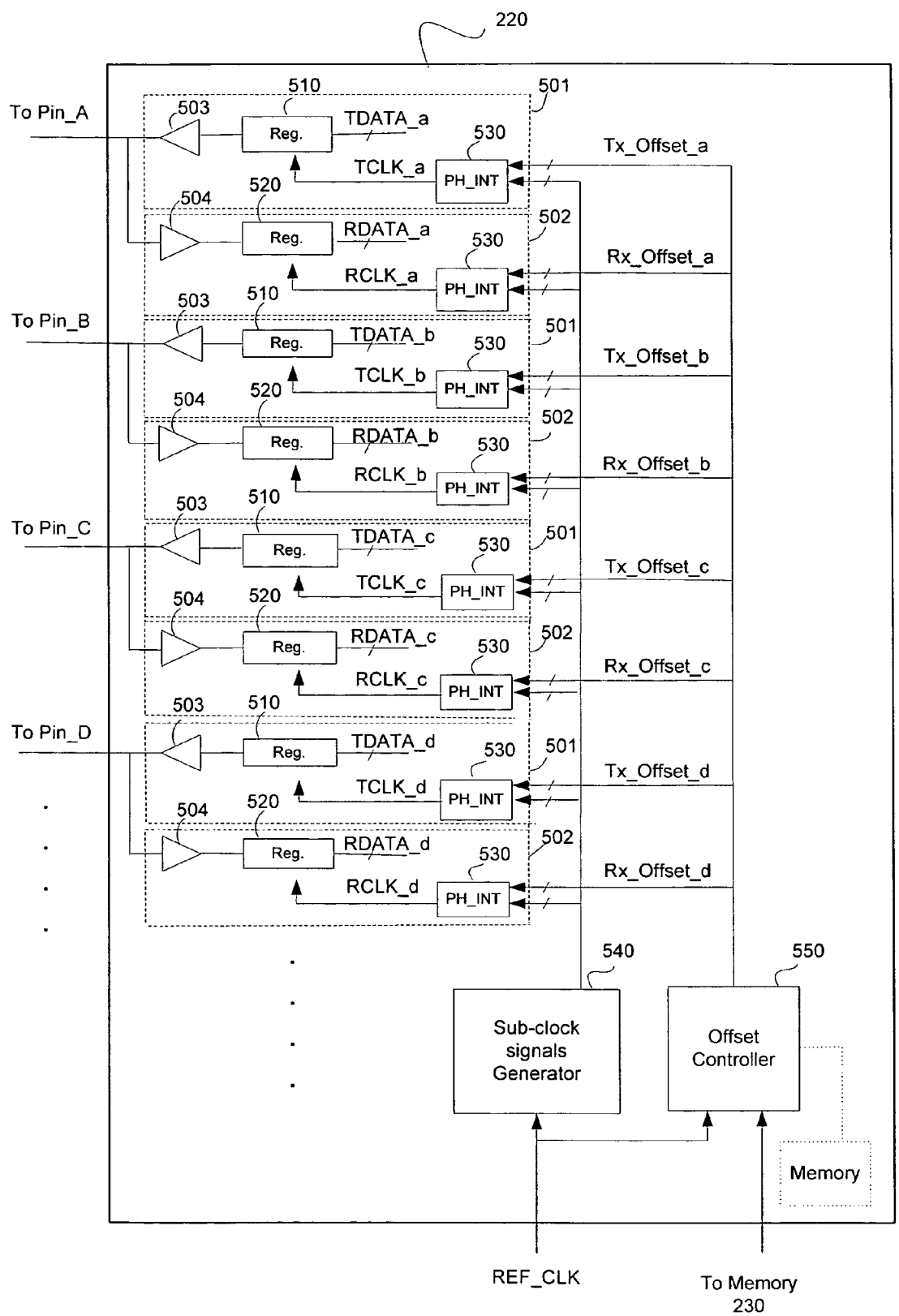
FIG. 4 depicts a portion of one implementation of one of the integrated circuits for coupling to the circuit board of FIG. 1.

Referring now to FIG. 4, there is shown a block diagram illustrating portions of one exemplary implementation of the integrated circuit 220. More specifically, the integrated circuit 220 has a bi-directional interface for coupling to the integrated circuit 210 and/or other devices via signal traces 240. Each input/output (I/O) pin of the interface has a transmit path 501 and a receive path 502. The transmit path 501 includes an output driver 503, a register circuit 510, and a phase interpolator circuit 530. The receive path 502 includes an input receiver 504, a register circuit 520, and a phase interpolator circuit 530. Each of the register circuits 510 and 520 can include one or more stages of registers for buffering outgoing and/or incoming data streams. In the illustrated embodiment, the outgoing data streams are labeled TDATA_a to TDATA_d, and the incoming data streams are labeled RDATA_a to RDATA_d.

Figure 5:
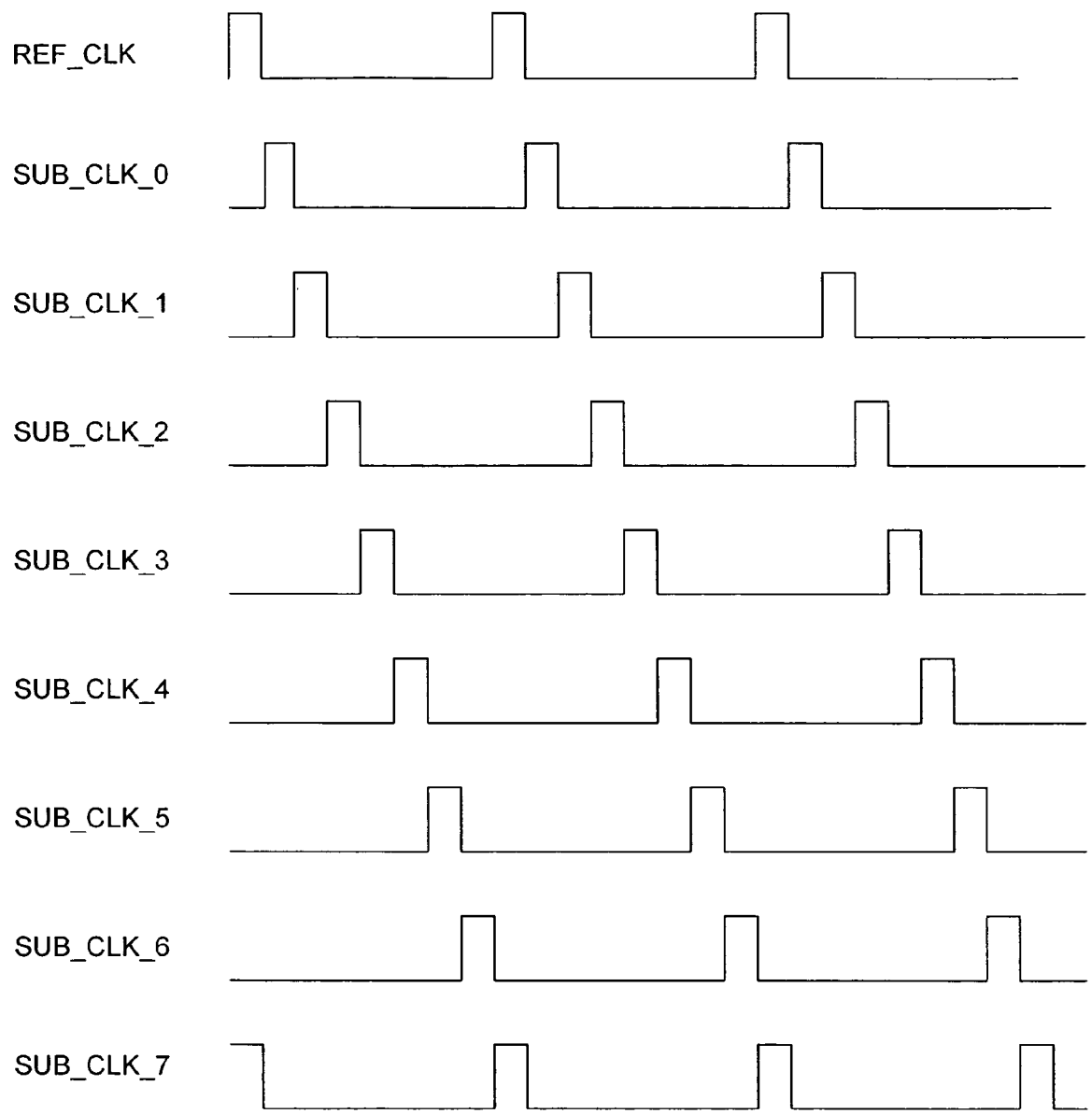
FIG. 5 depicts the timing of a reference clock signal and eight sub-clock signals generated by a sub-clock signal generator of FIG. 4.

Note that in the illustrated embodiment the phase interpolators 530 are coupled to a Sub-Clock Signal Generator 540 to receive a plurality of sub-clock signals. The Sub-Clock Signal Generator 540 can be implemented by a Phase-Locked Loop (PLL) circuit, a Delay-Locked Loop (DLL) circuit, or other circuits suitable for generating multiple clock signals. In operation, the Sub-Clock Signal Generator 540 receives a reference clock signal REF_CLK from an external source, and generates a plurality of sub-clock signals from the reference clock signal. In one embodiment, the Sub-Clock Signal Generator 540 generates eight sub-clocks that are offset from each other. Timing diagrams showing the reference clock signal REF_CLK and eight sub-clock signals are shown in FIG. 5. The sub-clock signals have the same frequency, but different phases.

In the illustrated embodiment, the Sub-Clock Signals Generator 540 is implemented within the integrated circuit 220. However, in other embodiments the Sub-Clock Signal Generator 540 can be implemented external to the integrated circuit 220, for instance, in another integrated circuit coupled to the circuit board 200.

Referring again to FIG. 4, the phase interpolators 530 receive the sub-clock signals from the Sub-Clock Signal Generator 540, select two of the sub-clock signals based on the offset value received from the offset controller 550, and blend the selected sub-clock signals to form new trace-specific clock signals, each having a trace-specific phase offset. An example of a phase interpolator that could be used in this context is disclosed in U.S. Pat. No. 5,554,945. The phase interpolators 530 are also coupled to receive control signals Tx_Offset_a-Tx_Offset_d and Rx_Offset_a-Rx_Offset_d from Offset Controller 550, which controls the desired phase offset by selecting the appropriate sub-clock signals to be blended, and by specifying the blend of the selected sub-clock signals that is to be generated. Note that the transmit paths 501 and the receive paths 502 each receive an individual offset control signal such that the transmit clocks (e.g., TCLK_a-TCLK_d) and the receive clocks (e.g., RCLK_a-RCLK_d) can be individually controlled. In this way, trace-specific clock signals (or pin-specific clock signals) that compensate for signal delay differences caused by unmatched signal trace lengths can be generated.

In one embodiment, the Offset Controller 550 receives empirical information of the signal traces from the memory 230 (or, from internal memory, in another embodiment where memory 230 is optional) and generates the control signals for the phase interpolators 530. The phase interpolators 530 then generate trace-specific clock signals for register circuits 510 and 520 in accordance with the control signals. As discussed above, the empirical information of the signal traces can be pre-determined signal trace length information that is obtained through actual measurement or extracted from CAD file(s). The empirical information can also be signal flight time information that is obtained through actual measurement or calculated from known signal trace lengths. The Offset Controller 550 may also use a pre-determined multiplier that accounts for variations in circuit board fabrication processes stored in memory 230 when generating the offset control signals. This pre-determined multiplier, in one embodiment, is determined by measuring the signal flight time of a dummy signal trace 250, as described in greater detail above.

Figure 6:
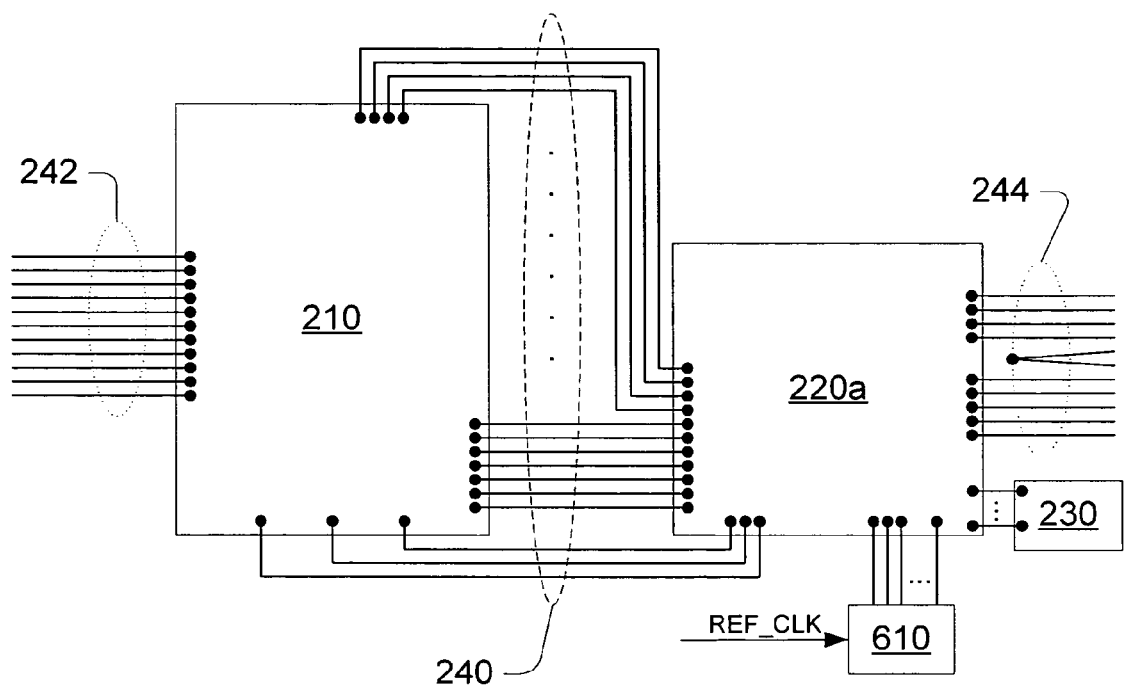
FIG. 6 depicts a portion of a circuit board having unmatched signal traces.
Figure 7:
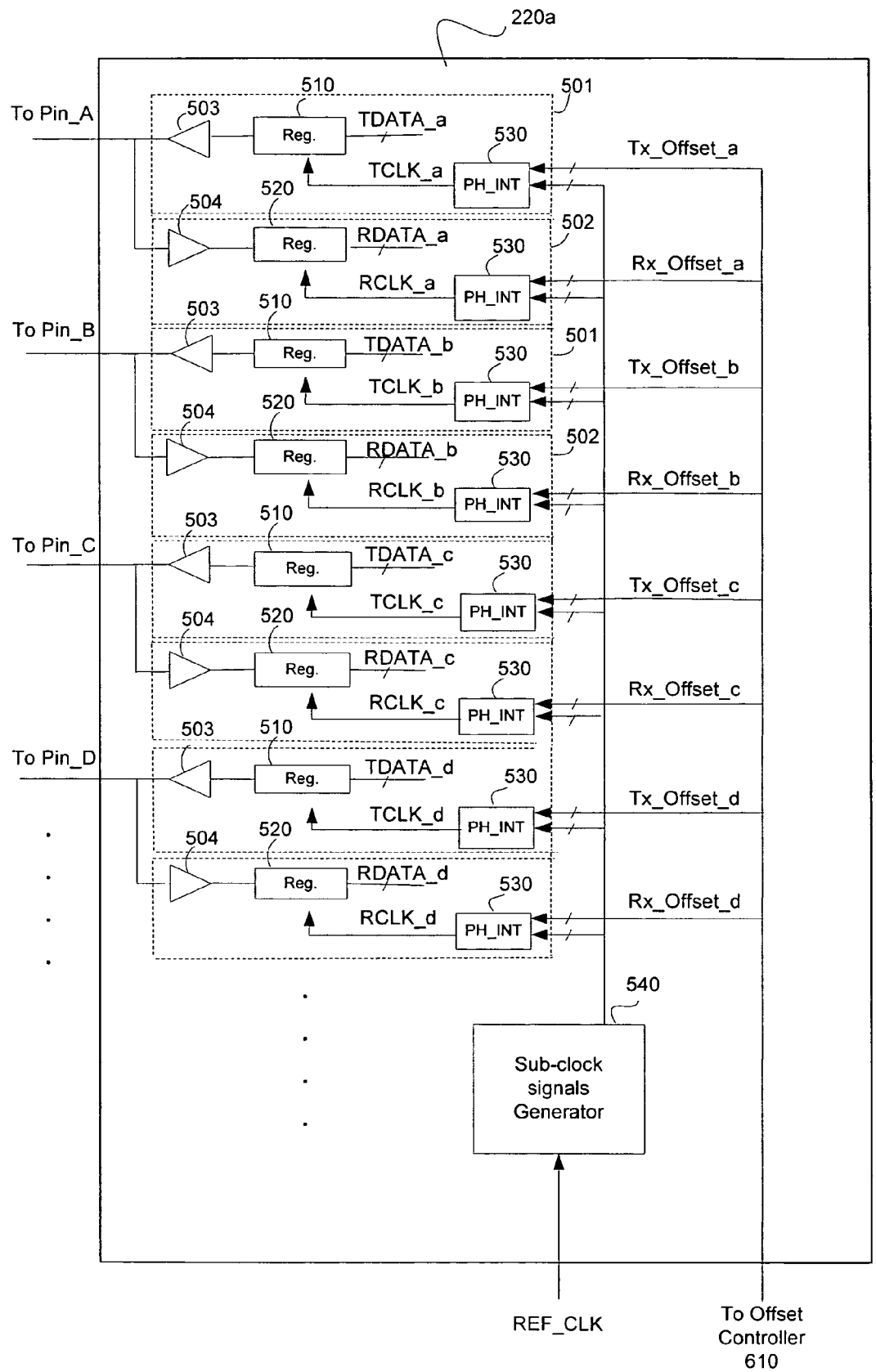
FIG. 7 depicts a portion of one implementation of one of the integrated circuits for coupling to the circuit board of FIG. 6.

Attention now turns to FIG. 6, which depicts a circuit board 600, or other system having a set of signal traces 240 for interconnecting devices, in accordance with another embodiment. In this embodiment, the memory 230, which is for storing the empirical information of the signal traces, provides the empirical information to an Offset Controller 610. The Offset Controller 610 generates control signals to be provided to the integrated circuit 220a for generating trace-specific clock signals that compensate for delay differences caused by the unmatched lengths of the signal traces 240. FIG. 7 depicts a portion of one implementation of the integrated circuit 220a, which is similar to the integrated circuit 220, except that the integrated circuit 220a does not have an internally implemented Offset Controller.

In one embodiment, the Offset Controller 610 (FIG. 6) is a processor that executes stored programs, and may be implemented either external to or within a memory controller. In another embodiment, the Offset Controller 610 is implemented as a state machine within integrated circuit 220a. The memory 230 may include both volatile and non-volatile storage. In one embodiment memory 230 not only stores phase information, but also stores boot code to be executed by the Offset Controller 610 upon system power up. The memory 230 may also store other programs to be executed by the Offset Controller 610, and may store other information as well, such as index values computed in order to index into a table of the phase values stored in memory 230. In one embodiment, upon system power up the Offset Controller 610 first sets the phase offsets to be used by integrated circuit 220a for transmitting and/or receiving signals exchanged between Offset Controller 610 and circuit 220a, and then the Offset Controller 610 executes the boot code stored in memory 230.

The embodiments described here as being implemented on or using a circuit board can also be implemented in multi-chip packages, multi-chip modules, and other systems where die or chips are stacked on top of one another, as well as systems having two or more circuit boards. For example, the systems and methods described above can be used equally as well for communications between integrated circuits within a single package, or between different circuits on the same integrated circuit. These embodiments can also be used in systems where an attempt has been made to match trace lengths, with the techniques and circuits described above being used to compensate for any remaining differences in trace lengths.

Figure 8:
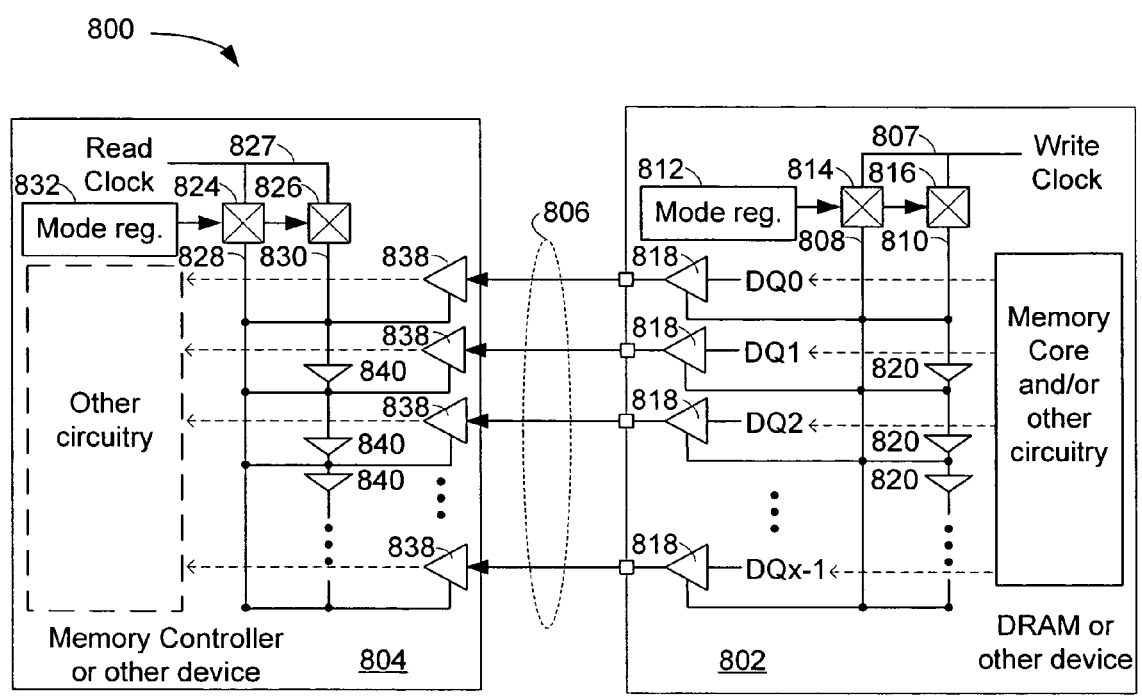
FIG. 8 depicts a circuit suitable for deliberately spreading data output switching times so as to decrease simultaneous switching output (SSO) noise of the transmitting device and the "ground bounce" caused by simultaneous switching data output signals.

In FIG. 8, a system 800 includes first device 802 that sends data or other information DQ0 to DQx-1 to a second device 804 over a set of x signal lines 806. The first device may be, for example, a dynamic random access memory (DRAM) device, and the second device may be, for example, a memory controller. Alternately, the first device may be a memory controller and the second device may be a semiconductor memory device. The two devices 802, 804 may be distinct integrated circuits, or may both be two circuits implemented on a single integrated circuit die, or may be two die on a wafer level integrated circuit. As will be explained next, the system 800 is configured so as to reduce simultaneous switching output (SSO) noise and ground bound in the transmitting device 802 by spreading the transmission times of the signals transmitted over parallel signal lines.

In the data sending device, 802, a write clock on signal line 807 is selectively coupled to either a first clock line 808 or a second clock line 810, in accordance with a mode value stored in a mode register 812. The mode signal stored in mode register 812 controls two switches 814, 816, closing one and opening the other. If switch 814 is closed, the write clock travels over the first clock line 808 to a set of output drivers 818, clocking all of the output drivers 818 simultaneously or virtually simultaneously (except for the extremely small phase differences caused by the minute differences in the distances the write clock travels to each of the output drivers 818). If switch 816 is closed, the write clock is transmitted through a sequence of delay elements 820, producing a serially distributed set of write clocks all having the same frequency, but having phase differences corresponding to the delay caused by a respective delay element 820 divided by the clock period of the write clock on line 807. For instance, if the write clock has a frequency of 500 MHz, with a clock period of 2 ns, and there are eight signal lines 806, each of the delay elements may delay the write signal by a delay time of 50 to 200 picoseconds. As a result, the signal transitions on the signal lines 806 will be spread over a period of time corresponding to the cumulative delay of the delay elements 820, thereby reducing SSO and ground bounce. If data is to be transmitted on both the rising and falling edges of the write clock, the cumulative delay of the delay elements 820 will typically be less than a half clock cycle. The delay values discussed here are solely exemplary, and other delay values may be used in other embodiments.

In the data receiving device, 804, a read clock on signal line 827 is selectively coupled to either a first clock line 828 or a second clock line 830, in accordance with a mode value stored in a mode register 832. The mode value in mode register 832 should be the same, or more generally correspond to the mode value in the mode register 812 of the data sending device 802. The mode signal stored in mode register 832 controls two switches 824, 826, closing one and opening the other. If switch 824 is closed, the read clock travels over the first clock line 828 to a set of signal receivers 838, clocking all of the signal receivers 838 simultaneously or virtually simultaneously (except for the extremely small phase differences caused by the minute differences in the distances the read clock travels to each of the signal receivers 838). If switch 826 is closed, the read clock is transmitted through a sequence of delay elements 840, producing a serially distributed set of read clocks all having the same frequency, but having phase differences corresponding to the delay caused by a respective delay element 840 divided by the clock period of the write clock on line 807. Typically, the delay elements 840 should have substantially the same delay as the delay elements 820 of the sending device 802.

In an alternate embodiment, fewer delay elements 820, 840 are used (e.g., 3 delay elements are used instead of 7, in a system having 8 signal lines 806), with each successively delayed write or read signal being used to transmit or receive two or more of the data signals. With appropriate control or selection of the delay times of the delay elements 820, 840, similar reductions in simultaneous switching noise and ground bounce can be obtained as in the embodiments described above with reference to FIG. 8.

The serially distributed clocks used in the system 800 of FIG. 8 may also be achieved using the circuitry of FIG. 4 or 7. In particular, in one embodiment the phases of the transmitting phase interpolator circuits 530 are be set so that the transition times of the transmitted signals are spread over a period of time, just as in the system of FIG. 8. For example, if all the signal lines are substantially equal in length, the phase offset values (e.g., Tx_Offset_a, Tx_Offset_b, etc.) delivered to the phase interpolator circuits 530 are set so that each successive output driver 503 is clocked at a successively delayed phase (e.g., Tx_Offset_b=Tx_Offset_a+delay_value), thereby causing the data transmit transitions to be spread over a portion of the write clock cycle. As explained above, this reduces simultaneous switching output noise and ground bound in the transmitting device. In another embodiment, in the circuits 220, 220a of FIGS. 4 and 7, the phase offset values (e.g., Tx_Offset_a, Tx_Offset_b, etc.) delivered to each respective phase interpolator circuit 530 is set equal to the sum of a respective signal line length compensation value and a respective phase spreading value (e.g., delay*i, where i is an integer representing the signal line position) so as to compensate for differences in signal line length and to ensure that data transmit transitions are spread over a portion of the write clock cycle. In the receive portions of the circuits 220, 220a of FIGS. 4 and 7, the phases of the read clocks generated by the phase interpolator circuits 530 are be adjusted to capture the transmitted data signals with phases corresponding to the phases at which those data signals are transmitted.

Methods and integrated circuit input/output interfaces that compensate for delay differences caused by unmatched signal trace lengths have been disclosed. The foregoing descriptions of specific embodiments are presented for purposes of illustration and explanation. The embodiments were chosen and described in order to best explain the principles of the invention and its practical applications, to thereby enable others to best utilize the invention. They are not intended to be exhaustive or to limit the invention to the precise forms disclosed. Various modifications may occur to those skilled in the art having the benefit of this disclosure without departing from the inventive concepts described herein. For example, the memory 230 can be implemented as a stand-alone memory, or as part of an integrated circuit of the circuit board 200. In a further example, the systems and methods described above can be used equally as well for communications between integrated circuits within a single package, or between different circuits on the same integrated circuit. Accordingly, it is the claims that are intended to define the exclusive rights of the invention.

What is claimed is:

1. An integrated circuit, comprising:
   an interface to couple to one or more integrated circuits via a plurality of signal traces, wherein at least two signal traces have unmatched signal trace lengths; and
   circuitry configured to generate a plurality of trace-specific clock signals having trace-specific phase offsets for the interface using pre-determined empirical information of the signal traces, wherein the trace-specific clock signals compensate for delay differences that are at least partially caused by the unmatched signal trace lengths, wherein the pre-determined empirical information comprises at least one of: length information of the signal traces, signal flight time information calculated from the lengths of the signal traces, and signal flight time information extracted from a computer-aided design data store.

2. The integrated circuit of claim 1, wherein the circuitry is further configured to generate the plurality of trace-specific clock signals based on a pre-determined multiplier value, wherein the multiplier value is generated by comparing a signal flight time across a reference signal trace with a reference signal flight time.

3. The integrated circuit of claim 1, wherein the pre-determined empirical information and a reference clock frequency value are used by the circuitry to determine the phase offsets.

4. The integrated circuit of claim 1, further comprising one or more memories to store values representative of the pre-determined empirical information of the signal traces.

5. The integrated circuit of claim 4, wherein the stored values comprise trace-specific phase offset values determined at least according to a first clock frequency and length values of the signal traces.

6. An integrated circuit, comprising:
   an interface to couple to one or more integrated circuits via a plurality of signal traces, wherein at least two signal traces have unmatched signal trace lengths; and
   circuitry configured to generate a plurality of trace-specific clock signals having trace-specific phase offsets for the interface using pre-determined empirical information of the signal traces, wherein the trace-specific clock signals compensate for delay differences that are at least partially caused by the unmatched signal trace lengths;
   a circuit to generate a plurality of sub-clock signals based on a reference clock signal; and
   a phase interpolator to blend selected ones of the plurality of sub-clock signals and the reference clock signal to generate at least one of the plurality of trace-specific clock signals.

7. A system, comprising:
   a plurality of signal traces to couple to an integrated circuit, wherein at least two signal traces have unmatched signal trace lengths; and
   a memory to couple to the integrated circuit and having stored therein pre-determined empirical information of the signal traces for use by the integrated circuit to generate trace-specific clock signals having trace-specific phase offsets using the pre-determined empirical information, wherein the trace-specific clock signals compensate for delay differences that are at least partially caused by the unmatched signal trace lengths, wherein the pre-determined empirical information comprises at least one of: length information of the signal traces, signal flight time information calculated from the lengths of the signal traces, and signal flight time information extracted from a computer-aided design data store.

8. The system of claim 7, wherein the empirical information comprises information and a reference clock frequency value are used by the integrated circuit to determine the phase offsets.

9. The system of claim 7, further comprising one or more memories to store values representative of the pre-determined empirical information.

10. The system of claim 9, wherein the stored values comprise trace-specific phase offset values determined at least according to a first clock frequency and length values of the signal traces.

11. The system of claim 10, wherein the stored values further comprise trace-specific phase offset values determined at least according to a second clock frequency and length values of the signal traces.

12. A system, comprising:
   a plurality of signal traces to couple to an integrated circuit, wherein at least two signal traces have unmatched signal trace lengths;
   a memory to couple to the integrated circuit and having stored therein pre-determined empirical information of the signal traces for use by the integrated circuit to generate trace-specific clock signals having trace-specific phase offsets using the pre-determined empirical information, wherein the trace-specific clock signals compensate for delay differences that are at least partially caused by the unmatched signal trace lengths; and
   a circuit to generate a plurality of sub-clock signals from a reference clock signal, and a phase interpolator to blend selected ones of the plurality of sub-clock signals and the reference clock signal to generate at least one of the plurality of trace-specific clock signals.

13. The system of claim 7, wherein the memory has stored therein a pre-determined multiplier value for use by the integrated circuit to generate the plurality of trace-specific clock signals based on a pre-determined multiplier value, wherein the multiplier value is generated by comparing a signal flight time across a reference signal trace with a reference signal flight time.

14. The system of claim 7, wherein the memory further stores boot code for execution by a processor coupled to the signal traces.

15. A system, comprising:
   trace means for coupling a plurality of signals to an integrated circuit, wherein at least two signal traces have unmatched signal trace lengths; and
   memory means, coupled to the integrated circuit and having stored therein pre-determined empirical information of the trace means for use by the integrated circuit to generate trace-specific clock signals having trace-specific phase offsets using the pre-determined empirical information, wherein the trace-specific clock signals compensate for delay differences that are at least partially caused by the unmatched signal trace lengths, wherein the pre-determined empirical information comprises at least one of: length information of the signal traces, signal flight time information calculated from the lengths of the signal traces, and signal flight time information extracted from a computer-aided design data store.

16. A system, comprising:
   a package;
   multiple integrated circuits within said package;
   a plurality of signal traces coupling said integrated circuits, wherein at least two signal traces have unmatched signal trace lengths; and a memory coupled to at least one of the integrated circuits and having stored therein pre-determined empirical information of the signal traces for use by the at least one integrated circuit to generate trace-specific clock signals having trace-specific phase offsets using the pre-determined empirical information, wherein the trace-specific clock signals compensate for delay differences that are at least partially caused by the unmatched signal trace lengths, wherein the pre-determined empirical information comprises at least one of: length information of the signal traces, signal flight time information calculated from the lengths of the signal traces, and signal flight time information extracted from a computer-aided design data store.

17. The system of claim 16, wherein the memory having stored therein a pre-determined multiplier value for use by the at least one integrated circuit to generate the plurality of trace-specific clock signals based on a pre-determined multiplier value, wherein the multiplier value is generated by comparing a signal flight time across a reference signal trace with a reference signal flight time.

18. The system of claim 16, wherein the empirical information and a reference clock frequency value are used by the integrated circuit to determine the phase offsets.

19. An integrated circuit comprising:
multiple circuits on a single integrated circuit;
a plurality of signal traces coupling said circuits, wherein at least two signal traces have unmatched signal trace lengths; and
a memory coupled to at least one of the circuits and having stored therein pre-determined empirical information of the signal traces for use by the at least one circuit to generate trace-specific clock signals having trace-specific phase offsets using the pre-determined empirical information, wherein the trace-specific clock signals compensate for delay differences that are at least partially caused by the unmatched signal trace lengths, wherein the pre-determined empirical information comprises at least one of: length information of the signal traces, signal flight time information calculated from the lengths of the signal traces, and signal flight time information extracted from a computer-aided design data store.

20. The integrated circuit of claim 19, wherein the memory having stored therein a pre-determined multiplier value for use by the at least one circuit to generate the plurality of trace-specific clock signals based on a pre-determined multiplier value, wherein the multiplier value is generated by comparing a signal flight time across a reference signal trace with a reference signal flight time.

21. The integrated circuit of claim 19, wherein the and a reference clock frequency value are used by the integrated circuit to determine the phase offsets.

22. The system of claim 15, wherein the memory means has stored therein a pre-determined multiplier value for use by the integrated circuit to generate the plurality of trace-specific clock signals based on a pre-determined multiplier value, wherein the multiplier value is generated by comparing a signal flight time across a reference signal trace with a reference signal flight time.

* * * * *